United States Patent
Prince et al.

(10) Patent No.: US 7,125,321 B2
(45) Date of Patent: Oct. 24, 2006

(54) MULTI-PLATEN MULTI-SLURRY CHEMICAL MECHANICAL POLISHING PROCESS

(75) Inventors: Matthew J Prince, Portland, OR (US); Mansour Moinpour, San Jose, CA (US); Francis M Tambwe, Hillsboro, OR (US); Gary Ding, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/014,889

(22) Filed: Dec. 17, 2004

(65) Prior Publication Data

US 2006/0135046 A1 Jun. 22, 2006

(51) Int. Cl.
*B24B 1/00* (2006.01)

(52) U.S. Cl. ............................... 451/57; 451/60; 451/41

(58) Field of Classification Search ................. 451/41, 451/57, 60, 285–289; 438/692, 693
See application file for complete search history.

(56) References Cited

U.S. PATENT DOCUMENTS

| | | | | |
|---|---|---|---|---|
| 6,069,081 A | * | 5/2000 | Kelleher et al. ............ | 438/692 |
| 6,227,949 B1 | * | 5/2001 | Yi et al. ..................... | 451/57 |
| 6,593,240 B1 | * | 7/2003 | Page .......................... | 438/692 |
| 2002/0173221 A1 | * | 11/2002 | Li et al. ..................... | 451/5 |
| 2004/0005845 A1 | * | 1/2004 | Kitajima et al. ............ | 451/57 |
| 2005/0075052 A1 | * | 4/2005 | Kim et al. .................. | 451/41 |
| 2005/0075056 A1 | * | 4/2005 | Wu et al. ................... | 451/57 |

* cited by examiner

*Primary Examiner*—Dung Van Nguyen
(74) *Attorney, Agent, or Firm*—Rahul D. Engineer

(57) ABSTRACT

A multi-platen, multi-slurry chemical mechanical polishing method comprises providing a substrate having a surface that includes at least one nitride structure and an oxide layer atop the nitride structure, performing a first CMP process on the substrate using a first platen with a silica based slurry to remove a bulk portion of the oxide layer without exposing the nitride structure, performing a second CMP process on the substrate using a second platen with a ceria based slurry to remove a residual portion of the oxide layer and to expose at least a portion of the nitride structure, and performing a third CMP process on the substrate using the first platen with a silica based slurry to remove at least one defect caused by the ceria based slurry.

16 Claims, 5 Drawing Sheets

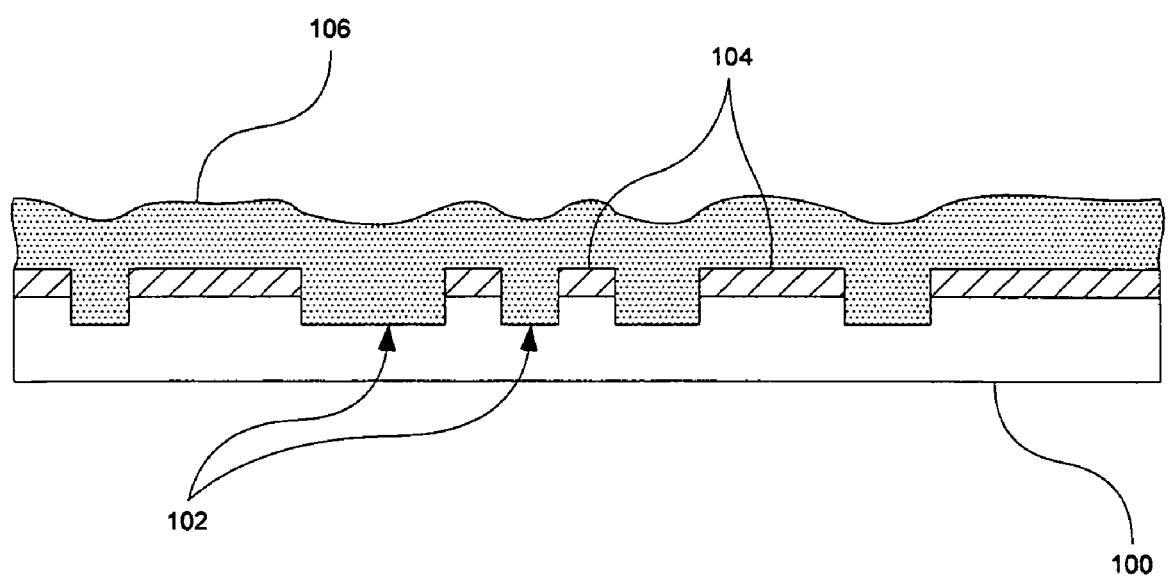
FIG_1

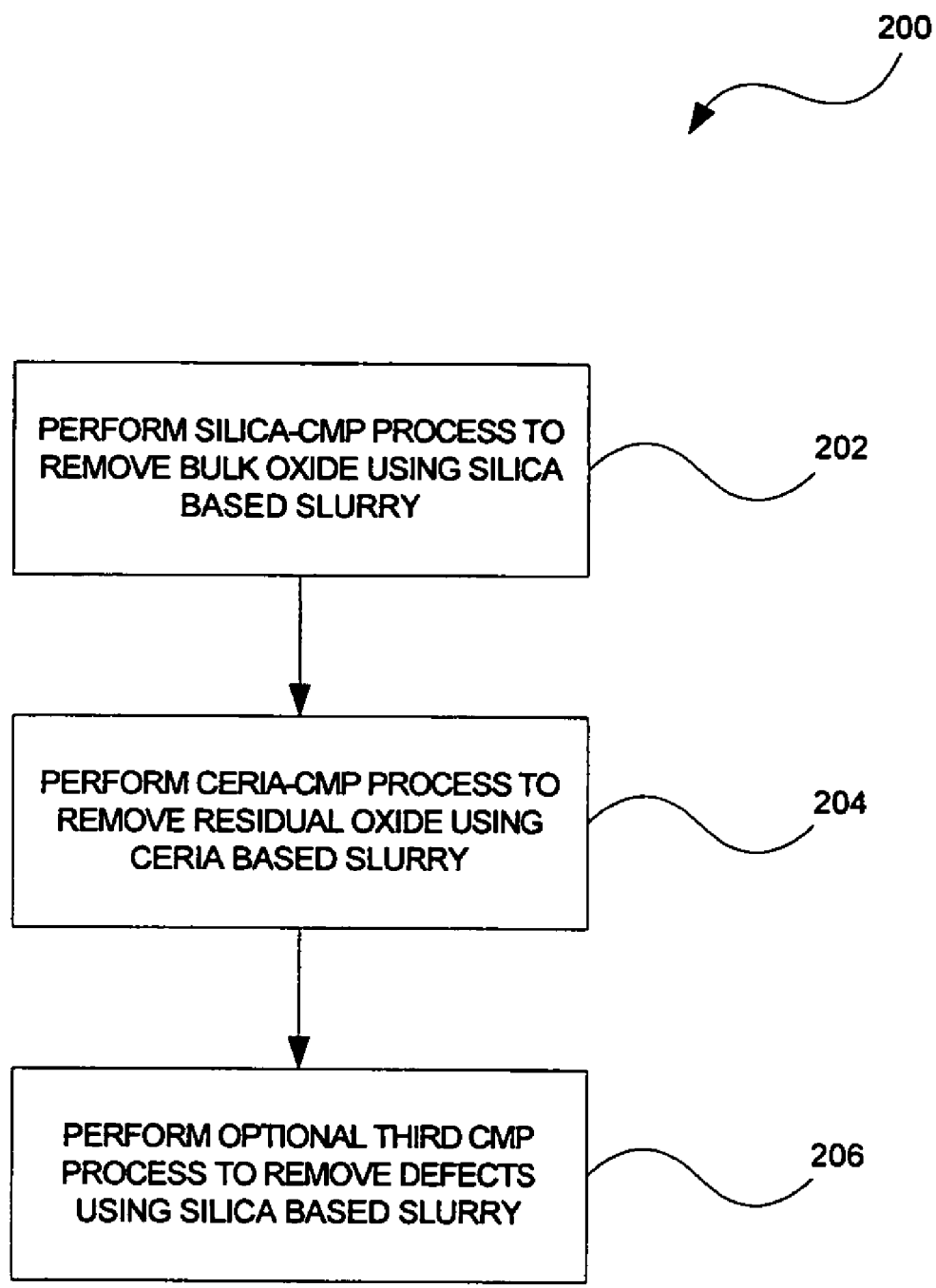
FIG_2

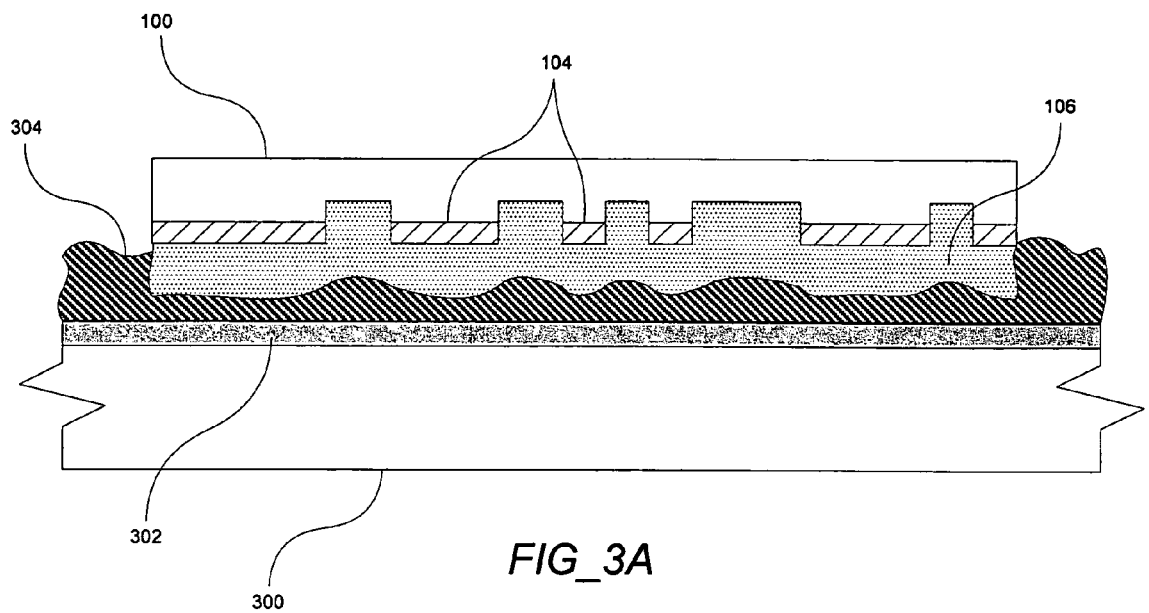
FIG_3A
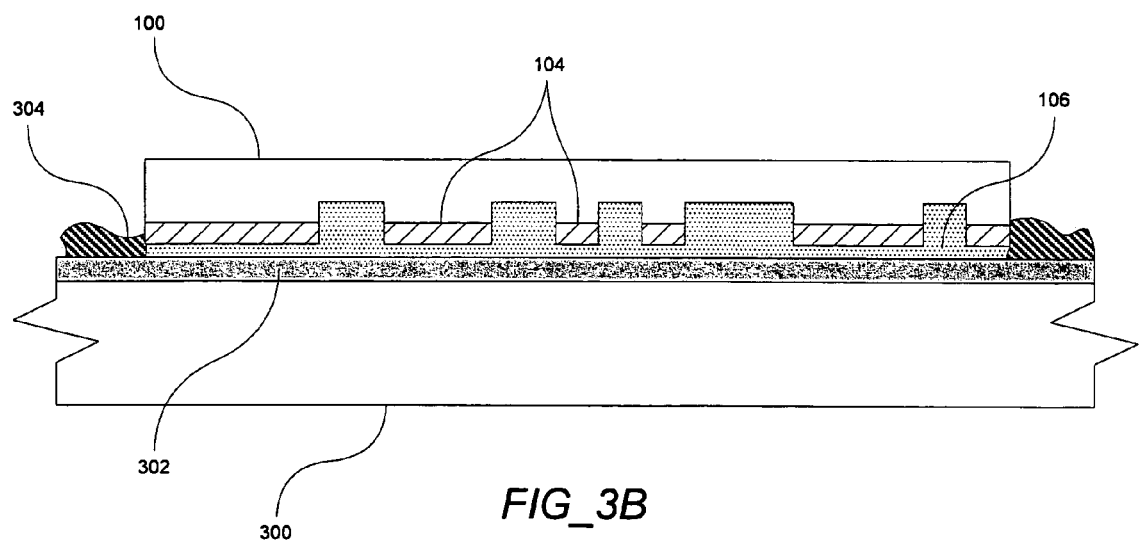
FIG_3B

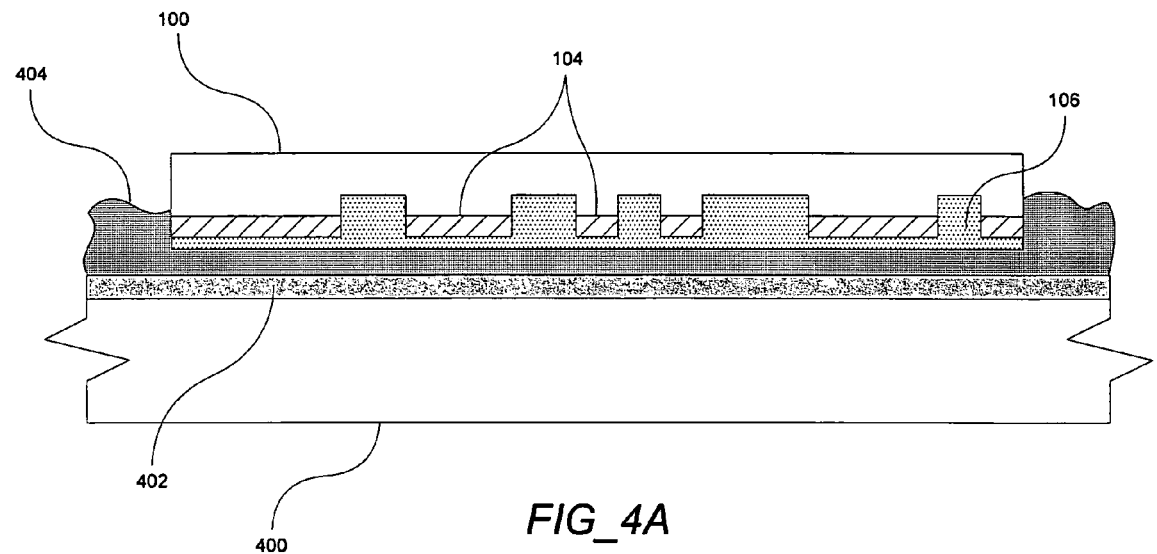
*FIG_4A*
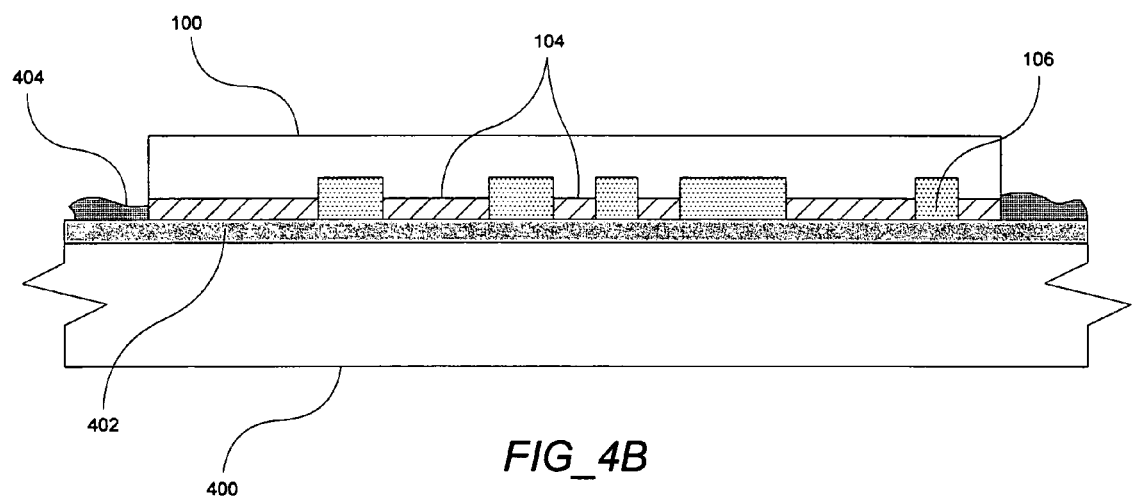
*FIG_4B*

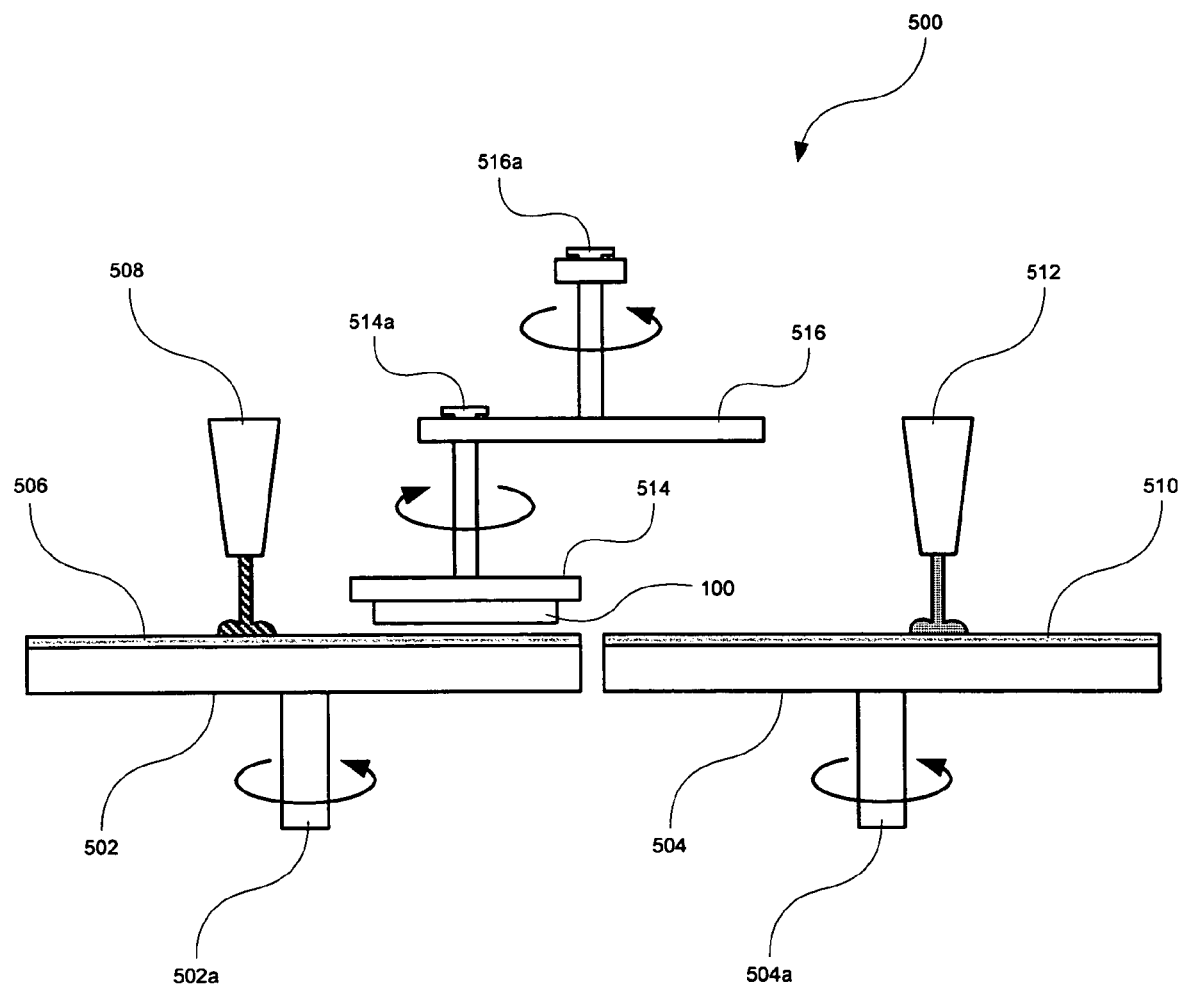
FIG_5

MULTI-PLATEN MULTI-SLURRY CHEMICAL MECHANICAL POLISHING PROCESS

BACKGROUND

Shallow trench isolation (STI) is a standard process used in nanofabrication to isolate the active areas of semiconductor devices. An STI process generally consists of digging trenches in the silicon wafers and filling them with a dielectric oxide material. A typical STI process includes a chemical mechanical polishing (CMP) step to planarize the dielectric oxide material after it has been deposited into the shallow trenches. Standard CMP processes generally use a silica-based oxide slurry to polish the STI layers.

Shallow trench isolation CMP using conventional, silica-based oxide slurries has a number of problems such as variation of pattern density across the die, non-uniform polishing rate within the wafer, and insufficient selectivity of oxide to nitride. Furthermore, current silica-based oxide slurries are not capable of meeting planarity requirements of STI modules for the sub-65 nm technology node. Silica-based slurries may leave oxide in some areas of the wafer while polishing nitride in other areas of the wafer, thereby causing problems for subsequent processing steps due to poor planarity on the surface of the polished wafer.

Ceria-abrasive based slurries are another option because they provide a unique across wafer uniformity advantage. These slurries do not have significant nitride polish rates, thereby allowing the polishing process to be stopped when the nitride layer is exposed without significant polishing of the nitride layer occurring. This results in excellent across-wafer uniformity. Ceria based slurries, however, entail a higher cost and have a higher incidence of defects.

BRIEF DESCRIPTION OF THE DRAWINGS

FIG. 1 is a semiconductor wafer having shallow trenches and an oxide layer.

FIG. 2 is an implementation of a CMP method for planarizing a substrate in accordance with the invention.

FIGS. 3A and 3B illustrate a CMP process to remove bulk oxide from the semiconductor wafer in accordance with an implementation of the invention.

FIGS. 4A and 4B illustrate a CMP process to remove residual oxide from the semiconductor wafer in accordance with an implementation of the invention.

FIG. 5 is an apparatus for planarizing a substrate in accordance with the invention.

DETAILED DESCRIPTION

Described herein are systems and methods of performing a chemical mechanical polishing process for substrates such as semiconductor wafers. The CMP processes described herein may be used, for example, as part of a shallow trench isolation (STI) process. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

FIG. 1 is an illustration of a substrate 100 upon which shallow trench isolation (STI) structures may be formed. The substrate 100 may be a semiconductor wafer formed of silicon. The substrate 100 may include trenches 102 that have been etched into a surface of the substrate 100. Between the trenches 102, the surface of the substrate 100 may be covered by silicon nitride structures 104 that are composed of, for example, SiN or $Si_3N_4$.

The process of forming STI structures generally requires that an oxide material 106 be deposited into the trenches 102. In implementations of the invention, this oxide material 106 may include, but is not limited to, dielectric oxides, tetra-ethyl-ortho-silicate (TEOS), silicon oxide (SiO), silicon dioxide ($SiO_2$), carbon doped oxide (CDO), and any other oxides that are used in forming STI structures. A chemical vapor deposition (CVD) method may be used to deposit the oxide material 106 into the trenches 102. Common CVD processes used for this include, but are not limited to, high density plasma CVD (HDPCVD) and plasma enhanced CVD (PECVD). The CVD process may deposit a blanket layer of oxide material 106 that covers the entire substrate 100 while filling the trenches 102.

The STI structures are defined by the trenches 102 and the oxide material 106 that fills the trenches 102. The excess oxide 106 and the silicon nitride structures 104, which are necessary to the STI structure formation process, may then be removed using various processes, including but not limited to CMP processes.

FIG. 2 is one implementation of a multi-platen, multi-slurry CMP process 200 for removing the excess oxide material 106 from atop the silicon nitride structures 104. The overall process 200 begins with a silica-CMP process to remove a portion of the excess oxide layer 106 from the substrate 100 (202). In some implementations, the silica-CMP process may remove a substantial or bulk portion of the oxide material 106. For example, if the substrate 100 has a layer of oxide material 106 that is 8000 Angstroms (Å) thick, the silica-CMP process may polish that oxide layer 106 down to a thickness of approximately 2000 Å. It should be noted that this is just one example and the layer of oxide material 106 may begin with a thickness that is greater than or less than 8000 Å, and the oxide layer 106 may be polished down to a thickness that is greater than or less than 2000 Å. In some implementations, the silica-CMP process may remove greater than fifty percent of the oxide material 106. In implementations of the invention, the silica-CMP process may be performed on a first platen using a silica based slurry and a polishing pad that is appropriate to remove the oxide material 106.

As mentioned above, silica based slurries tend to have low oxide-to-nitride selectivity. Silica based slurries therefore have high polishing rates for both oxide and nitride. For instance, conventional silica based slurries often have oxide polish rates of around 2000 Å/min and nitride polish rates of around 500 Å/min. This means that for every 4 Å of oxide that is removed in a minute, 1 Å of nitride is removed. So when an effort is made to completely remove the oxide material 106 from atop the silicon nitride structures 104 using a silica based slurry, a substantial portion of the silicon nitride structures 104 may be removed as well.

In accordance with the invention, due to the low oxide-to-nitride selectivity of the silica based slurry, the silica-CMP process is not used to expose the silicon nitride structures 104. The silica-CMP process is therefore halted before the polishing pad comes into contact with the silicon nitride structures 104. This allows the silica-CMP process to planarize and polish away a bulk portion of the oxide material 106 while leaving a layer of oxide material 106 intact over the silicon nitride structures 104.

The use of a silica based slurry in the silica-CMP process results in a lower cost and fewer defects being formed relative to ceria based slurries. A substantial portion of the oxide material 106 may be removed inexpensively and with few defects by the silica-CMP process.

In some implementations, the silica-CMP process may use conventional silica based slurries such as, for example, the SS25 slurry manufactured by Cabot Microelectronics Corporation of Aurora, Ill., or the PL-4217 slurry manufactured by Fujimi of Tualatin, Oreg. Other conventional silica based slurries may be used as well. Polishing pads that may be used for the silica-CMP process of the invention include hard urethane pads, such as the IC-1000, IC-1020, or the IC-1010, all manufactured by Rohm and Haas Electronic Materials CMP Technologies (formerly Rodel) of Phoenix, Ariz. Urethane pads from JSR Micro, Inc. of Sunnyvale, Calif. may be used. Again, many conventional polishing pads may be used for the silica-CMP process.

The following process conditions may be used for some implementations of the silica-CMP process of the invention. The first platen may have a rotation speed that ranges from 10 to 150 rotations per minute (RPM). The semiconductor wafer being polished may be mounted on a wafer carrier, and the wafer carrier may have a rotation speed that ranges from 10 to 150 RPM. A polish pressure may range from 0.5 to 7 pounds per square inch (psi). The silica based slurry may flow at a rate that ranges from 50 to 500 milliliters per minute (ml/min). The process temperature may range from 15° C. to 40° C. The polish time is dependent upon the amount of oxide that is being removed by the silica-CMP process but may typically range from 30 to 180 seconds. In some implementations, a pad conditioning process may be performed using, for example, a diamond abrasive disk manufactured by companies that include, but are not limited to, 3M Corporation of St. Paul, Minn. or Mitsubishi Materials Corporation of Tokyo, Japan.

The process 200 continues with a ceria-CMP process to remove substantially all of the residual oxide atop the silicon nitride structures 104 (204). For example, if the silica-CMP process polishes an approximately 8000 Å oxide layer down to approximately 2000 Å, then the ceria-CMP process may polish substantially all of the remaining 2000 Å. Again, it should be noted that the thicknesses of 8000 Å and 2000 Å are given merely to provide one example of the invention. In implementations of the invention, the ceria-CMP process may remove less than thirty percent of the oxide material 106. In some implementations, the ceria-CMP process may be halted when the polishing pad contacts the silicon nitride structures 104. Therefore, the ceria-CMP process may remove very little or no oxide material 106 that remains in the trenches between the silicon nitride structures 104. In other implementations, the ceria-CMP process may remove a portion of the silicon nitride structures 104 and the oxide material 106 remaining between the silicon nitride structures 104.

Due to the high oxide-to-nitride selectivity of the ceria based slurry, the ceria-CMP process has a low nitride polish rate compared to its oxide polish rate. For instance, conventional ceria based slurries often have oxide polish rates of around 1000 Å/min while their nitride polish rates are only around 10 Å/min. This means that unlike silica based slurries which polish 1 Å of nitride for every 4 Å of oxide, ceria based slurries polish 1 Å of nitride for every 100 Å of oxide. The ceria based slurries therefore have substantially lower nitride removal rates than the silica based slurries which enables the ceria-CMP process to remove the oxide material 106 while polishing very little of the nitride. At the end of the ceria-CMP process, the surface of the wafer tends to have excellent planarity relative to a surface polished using only a silica-CMP process.

In some implementations of the invention, the ceria-CMP process may be performed on a second platen using a ceria based slurry and a polishing pad that is appropriate for use with a ceria-based slurry. In some implementations, the ceria-CMP process may use conventional ceria-based slurries such as, for example, the SiLect 6000 slurry manufactured by Cabot Microelectronics Corporation or the Tizox 8268 slurry manufactured by Ferro Corporation of Cleveland, Ohio. Other ceria-based slurries may also be used, including but not limited to ceria-based slurries manufactured by companies such as Hitachi Chemical Co., Ltd. of Tokyo, Japan and JSR Micro, Inc. of Sunnyvale, Calif. Conventional polishing pads that may be used for the ceria-CMP process of the invention include hard urethane pads manufactured by Rohm and Haas Electronic Materials CMP Technologies, urethane pads manufactured by JSR Micro, Inc., or any of the other polishing pads known for use with ceria-based slurries including soft polishing pads. The only disadvantage to using soft polishing pads is that there may be some oxide loss in the trenches between the silicon nitride structures 104.

The following process conditions may be used for some implementations of the ceria-CMP process of the invention. The second platen may have a rotation speed that ranges from 10 to 150 RPM and the wafer carrier may have a rotation speed that ranges from 10 to 150 RPM. A polish pressure may range from 0.5 to 7 psi. The ceria based slurry may flow at a rate that ranges from 50 to 500 ml/min. The process temperature may range from 15° C. to 40° C. The polish time is dependent upon the amount of oxide that is being removed by the ceria-CMP process, but may typically range from 30 to 180 seconds. In some implementations, a pad conditioning process may be performed using, for example, a diamond abrasive disk manufactured by companies that include, but are not limited to, 3M Corporation or Mitsubishi Materials Corporation.

The use of a silica based slurry in the first CMP process provides inexpensive bulk oxide removal while the use of a ceria based slurry in the second CMP process provides good topography control due to the high oxide-to-nitride selectivity of the ceria based slurry. Furthermore, limiting the usage of the expensive ceria based slurry to only the second CMP process improves the overall cost of the process relative to processes that use ceria based slurries for removing the entire oxide layer. The primary drawback to the use of ceria based slurries in the second CMP process is that ceria based slurries tend to result in a greater occurrence of defects. Since defects are a significant concern with the ceria-based slurries, limiting the amount of polish time for the ceria-based slurry in accordance with the invention may reduce the risk of defects.

In further implementations of the invention, as shown in FIG. 2, an optional third CMP process may be performed to reduce or substantially remove defects (206). Because ceria based slurries have a higher tendency to leave defects, the third CMP process may remove defects that may be caused by the ceria-CMP process. The third CMP process may act as a final buffing step for the substrate 100. In some implementations, this third CMP process may be a distilled water buff, a chemical buff, or a low removal slurry buff to reduce defects.

In implementations of the invention, the optional third CMP process may be performed on a third platen using a silicon based slurry and a polishing pad that is appropriate to remove defects from the substrate 100. For instance, a soft polishing pad such as a Politex® pad manufactured by Rohm and Haas Electronic Materials CMP Technologies may be used. In other implementations, the first platen may be used to perform the third CMP process. The first platen may be use the same polishing pad and slurry as the silica-CMP process to perform the third CMP process.

FIGS. 3A and 3B illustrate the silica-CMP process on the substrate 100. In FIG. 3A the substrate 100 is shown in proximity to a first platen 300, and in FIG. 3B the substrate 100 is shown as it nears the end of the silica-CMP process.

The first platen 300 includes a polishing pad 302 mounted on a top surface of the platen 300. The polishing pad 302 is one that is suitable for use with a silica based slurry 304, also shown in FIGS. 3A and 3B on a top surface of the polishing pad 302.

As shown in FIGS. 3A and 3B, the substrate 100 may be oriented face down so the oxide layer 106 may contact the polishing pad 302. The platen 300 rotates during the CMP process, thereby causing the polishing pad 302 to abrade the oxide layer 106. The silica based slurry 304 works in conjunction with the polishing pad 302 to remove the oxide layer 106. In FIG. 3B, a substantial portion of the oxide layer 106 has been removed by the polishing pad 302 and the slurry 304. In accordance with the invention, the oxide layer 106 may be removed until only a relatively thin layer of oxide remains over the silicon nitride structures 104, as shown in FIG. 3B.

FIGS. 4A and 4B illustrate the ceria-CMP process. In FIG. 4A, the substrate 100 is shown in proximity to a second platen 400, and in FIG. 4B the substrate 100 is shown as it nears the end of the ceria-CMP process. The second platen 400 includes a polishing pad 402 that is mounted on a surface of the platen 400. The polishing pad 402 is suitable for use with a ceria based slurry 404, shown in FIGS. 4A and 4B on a surface of the polishing pad 402.

As before, the substrate 100 may be oriented face down while the second platen 400 rotates to cause the polishing pad 402 to abrade the thin oxide layer 106 that remains over the silicon nitride structures 104. In FIG. 4B, substantially the entire thin oxide layer 106 has been removed by the polishing pad 402 and the ceria based slurry 404. The end result is an oxide removal process that yields a wafer surface with excellent planarity. In some implementations, as described above, a third CMP process may be performed to buff defects out of the surface of the substrate 100 that may have been caused by use of the ceria based slurry 404.

The methods of the invention may be carried out on conventional CMP tools, including but not limited to the Applied Mirra CMP or the Applied Mirra Mesa CMP tools, both manufactured by Applied Materials of Santa Clara, Calif. The methods of the invention may also be carried out on systems dedicated to the multi-platen multi-slurry approach described above.

FIG. 5 illustrates such a system. FIG. 5 is a polishing apparatus 500 in accordance with one implementation of the invention. The polishing apparatus 500 includes a first platen 502 and a second platen 504 to carry out the silica and ceria CMP processes described above. The first platen 502 may include a first polishing pad 506 that is optimized for use with silica based slurries. Suitable polishing pads for use as polishing pad 506 are described above. The first platen 502 may rotate about a first axis 502a to enable polishing of the substrate 100. In some implementations, the polishing apparatus 500 may also include a slurry dispenser 508 to apply silica based slurries to the first polishing pad 506. Suitable silica based slurries are also described above.

Similar to the first platen 502, the second platen 504 may include a second polishing pad 510 that is optimized for use with ceria based slurries. Suitable polishing pads for use as polishing pad 510 are described above. The second platen 504 may rotate about a second axis 504a to enable polishing of the substrate 100. A slurry dispenser 512 may also be included in the polishing apparatus 500 to apply ceria based slurries to the first polishing pad 506. Suitable ceria based slurries are also described above.

In some implementations, the first platen 502 may be used to perform the third CMP process described above. In some implementations, the third CMP process may use the same polishing pad 506 and the same silicon based slurry as the silica-CMP process. In other implementations, the polishing pad 506 and the slurry may be replaced prior to performing the third CMP process. In alternate implementations, the polishing apparatus may include a third platen (not shown) to perform the third CMP process. The third platen may include a third polishing pad. In some implementations, the third polishing pad may be the same type as the first polishing pad 506, while in some implementations the third polishing pad may be different than the first polishing pad 506. For instance, unlike the first polishing pad 506, the third polishing pad may be a soft polishing pad. Likewise, in some implementations the slurry used in the third CMP process may be the same as the slurry used for the first CMP process, while in some implementations the third slurry may be different than the slurry used for the first CMP process.

The polishing apparatus 500 may include a substrate mount 514 used to hold the substrate 100 and press the substrate 100 into a polishing pad during a CMP process. The substrate mount 514 may rotate about an axis 514a to enable the substrate 100 to rotate during any of the CMP processes. The substrate mount 514 may be coupled to an arm 516 that is capable of moving the substrate mount 514 from one platen to another. The arm 516 may rotate about an axis 516a to enable movement of the substrate mount 514 between the first platen 502 and the second platen 504. In some implementations, the arm 516 may also be able to move the substrate mount 514 to a third platen if a third platen is included in the polishing apparatus 500.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   polishing a substrate using a silica based slurry to remove a first portion of an oxide layer from a surface of the substrate;
   polishing the substrate using a ceria based slurry to remove a second portion of the oxide layer from the surface of the substrate; and
   polishing the substrate using the silica based slurry to remove one or more defects caused by the ceria based slurry.

2. The method of claim 1, wherein the surface of the substrate includes at least one nitride structure, and wherein the polishing of the substrate using the silica based slurry is halted prior to the nitride structure being exposed.

3. The method of claim 2, wherein the polishing of the substrate using the ceria based slurry is halted when the nitride structure is exposed.

4. The method of claim 1, wherein the first portion comprises a bulk portion of the oxide layer.

5. The method of claim 1, wherein the first portion comprises greater than fifty percent of the oxide layer.

6. The method of claim 1, wherein the second portion comprises a residual portion of the oxide layer.

7. The method of claim 1, wherein the second portion comprises less than thirty percent of the oxide layer.

8. The method of claim 1, wherein the polishing of the substrate using a silica based slurry includes abrading the oxide layer with a urethane polishing pad.

9. The method of claim 1, wherein the polishing of the substrate using a ceria based slurry includes abrading the oxide layer with a urethane polishing pad.

10. A method comprising:
    providing a substrate having a surface that includes at least one nitride structure and an oxide layer atop the nitride structure;
    performing a first CMP process on the substrate using a silica based slurry to remove a bulk portion of the oxide layer without exposing the nitride structure;
    performing a second CMP process on the substrate using a ceria based slurry to remove a residual portion of the oxide layer and to expose at least a portion of the nitride structure; and
    performing a third CMP process on the substrate using a silica based slurry to remove at least one defect caused by the ceria based slurry.

11. The method of claim 10, wherein the bulk portion comprises greater than fifty percent of the oxide layer.

12. The method of claim 10, wherein the residual portion comprises less than thirty percent of the oxide layer.

13. The method of claim 10, wherein the first CMP process, the second CMP process, and the third CMP process are all performed on a single CMP tool.

14. The method of claim 10, wherein the first CMP process includes using a hard urethane polishing pad to remove the bulk portion of the oxide layer.

15. The method of claim 10, wherein the second CMP process includes using a hard urethane polishing pad to remove the residual portion of the oxide layer.

16. The method of claim 10, wherein the third CMP process includes using a soft polishing pad to remove the at least one defect.

* * * * *